US009536510B2

(12) United States Patent
Christoph

(10) Patent No.: US 9,536,510 B2
(45) Date of Patent: Jan. 3, 2017

(54) SOUND SYSTEM INCLUDING AN ENGINE SOUND SYNTHESIZER

(71) Applicant: Harman Becker Automotive Systems GmbH, Karlsbad (DE)

(72) Inventor: Markus Christoph, Straubing (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 67 days.

(21) Appl. No.: 14/572,221

(22) Filed: Dec. 16, 2014

(65) Prior Publication Data

US 2015/0170629 A1 Jun. 18, 2015

(30) Foreign Application Priority Data

Dec. 16, 2013 (EP) .................................... 13197399

(51) Int. Cl.

*H04R 3/00* (2006.01)
*H03G 3/00* (2006.01)
*G10H 5/00* (2006.01)
*G10K 15/02* (2006.01)

(52) U.S. Cl.

CPC ................ *G10H 5/00* (2013.01); *G10K 15/02* (2013.01)

(58) Field of Classification Search

None

See application file for complete search history.

(56) References Cited

U.S. PATENT DOCUMENTS

| | | | | |
|---|---|---|---|---|
| 5,371,802 | A * | 12/1994 | McDonald | G10K 15/02 381/110 |
| 7,203,321 | B1 | 4/2007 | Freymann et al. | |
| 8,320,581 | B2 | 11/2012 | Hera et al. | |
| 2005/0169484 | A1 | 8/2005 | Cascone et al. | |
| 2006/0215846 | A1 | 9/2006 | Kobayashi et al. | |
| 2007/0230716 | A1* | 10/2007 | Kobayashi | B60R 11/0217 381/86 |
| 2007/0234879 | A1* | 10/2007 | Kobayashi | G10H 1/14 84/600 |

(Continued)

FOREIGN PATENT DOCUMENTS

EP 2450878 A1 5/2012

OTHER PUBLICATIONS

European Search Report for corresponding Application No. 13197399.2, mailed Jun. 4, 2014, 6 pages.

*Primary Examiner* — Thang Tran
(74) *Attorney, Agent, or Firm* — Brooks Kushman P.C.

(57) ABSTRACT

A system for reproducing synthetic engine sound in at least one listening position of a listening room is described. In accordance an example of, the system includes a model parameter database including various pre-defined sets of model parameters. An engine sound synthesizer receives at least one guide signal and is configured to select one set of model parameters in accordance with the at least one guide signal. The engine sound synthesizer generates a synthetic engine sound signal in accordance with the selected set of model parameters. At least one loudspeaker is used for reproducing the synthetic engine sound. The system further includes one of the following: (1) an equalizer and (2) a model parameter and the effect of the listening room on the resulting acoustic signal is approximately compensated at the one listening position.

22 Claims, 5 Drawing Sheets

(56) References Cited

U.S. PATENT DOCUMENTS

| | | | | |
|---|---|---|---|---|
| 2009/0028353 | A1* | 1/2009 | Kobayashi | A63G 31/16 381/61 |
| 2009/0225995 | A1* | 9/2009 | Kotegawa | H03G 3/32 381/57 |
| 2012/0101611 | A1* | 4/2012 | Inoue | G10K 15/02 700/94 |
| 2012/0230504 | A1* | 9/2012 | Kuroda | G10K 11/178 381/71.4 |
| 2015/0139442 | A1 | 5/2015 | Kreifeldt et al. | |

* cited by examiner

SOUND SYSTEM INCLUDING AN ENGINE SOUND SYNTHESIZER

CROSS-REFERENCE TO RELATED APPLICATIONS

This application claims priority to EP Application No. 13 197 399.2, filed Dec. 16, 2013, the disclosure of which is incorporated in its entirety by reference herein.

TECHNICAL FIELD

Various embodiments relate to the field of sound synthesis, particularly to synthesizing the sound of a combustion engine.

BACKGROUND

The growing popularity of hybrids and electric vehicles gives rise to new safety issues in urban environments, as many of the aural cues associated with (combustion) engine noise can be missing. The solution is to intelligently make vehicles noisier. In fact, several countries have established laws that require cars to radiate a minimum level of sound in order to warn other traffic participants of an approaching car.

Some research has been conducted in the field of analyzing and synthesizing sound signals, particularly in the context of speech processing. However, the known methods and algorithms typically require powerful digital signal processors, which are not suitable for the low-cost applications that the automotive industry requires. Synthetic (e.g., combustion engine) sound is not only generated to warn surrounding traffic participants; it may also be reproduced in the interior of the car to provide the driver with acoustic feedback concerning the state of the engine (rotational speed, engine load, throttle position, etc.). However, when synthetic motor sound is reproduced through loudspeakers, the driver will perceive the sound as different from a real combustion engine. There is thus a general need for an improved method for synthesizing motor sound.

SUMMARY

A system for reproducing synthetic engine sound in at least one listening position of a listening room is described. In accordance with an example of the invention, the system comprises a model parameter database including various pre-defined sets of model parameters. An engine sound synthesizer receives at least one guide signal and is configured to select one set of model parameters in accordance with the guide signal(s). The engine sound synthesizer generates a synthetic engine sound signal in accordance with the selected set of model parameters. At least one loudspeaker is used for reproducing the synthetic engine sound by generating a corresponding acoustic signal. Moreover, the system comprises one of the following: (1) an equalizer that receives the synthetic engine sound signal and that is configured to filter the synthetic engine sound signal in accordance with a filter transfer function, which is set such that the effect of the listening room on the resulting acoustic engine sound signal is approximately compensated at the listening position(s); and (2) a model parameter tuning unit, which is configured to modify the pre-defined sets of model parameters in the model parameter database in accordance with an equalizer filter parameter set such that, when the resulting synthetic engine sound signal is generated from a modified set of model parameters, the effect of the listening room on the resulting acoustic signal is approximately compensated at the listening position(s).

Moreover, a method for reproducing synthetic engine sound in at least one listening position of a listening room using at least one loudspeaker is described. In accordance with another embodiment the method comprises providing a model parameter database including various pre-defined sets of model parameters, receiving at least one guide signal and selecting one set of model parameters in accordance with the guide signal(s). At least one synthetic engine sound signal is synthesized in accordance with the selected set of model parameters. The synthetic engine sound signal(s) is reproduced by generating corresponding acoustic engine sound signal(s). Furthermore, the method comprises one of the following: (1) filtering the synthetic engine sound signal in accordance with a filter transfer function which is set such that the effect of the listening room on the resulting acoustic engine sound signal is approximately compensated at the listening position(s); and (2) modifying the pre-defined sets of model parameters in the model parameter database in accordance with a set of equalizing filter parameters such that, when the resulting synthetic engine sound signal is generated from a modified set of model parameters, the effect of the listening room on the resulting acoustic engine sound signal is approximately compensated at the listening position(s).

BRIEF DESCRIPTION OF THE DRAWINGS

The various embodiments can be better understood with reference to the following drawings and descriptions. The components in the figures are not necessarily to scale, emphasis instead being placed upon illustrating the principles of the invention. Moreover, in the figures, like reference numerals designate corresponding parts. In the drawings.

DETAILED DESCRIPTION

The sound perceivable from the outside of a car is dominated by the engine sound for a driving speed of up to 30-40 km per hour. The sound of the engine is therefore the dominant "alarm signal" that warns other traffic participants of an approaching car, particularly in urban regions where the driving speeds are low. As mentioned above, it may be required for electric or hybrid cars to radiate a minimum level of sound to allow people, particularly pedestrians and people with reduced hearing capabilities, to hear an approaching car. Furthermore, the typical sound of a combustion engine may also be desired in the interior of a car to provide the driver with an acoustic feedback about the operational status of the car (with regard to rotational speed, throttle position, engine load or the like).

In many applications, the signals of interest are composed of a plurality of sinusoidal signal components corrupted by broadband noise. A sinusoidal or "harmonic" model is appropriate to analyze and model such signals. In addition, signals that mainly consist of sinusoidal components can be found in different applications such as formant frequencies in speech processing. Sinusoidal modeling may also be successfully applied to analyze and synthesize the sound produced by musical instruments since they generally produce harmonic or nearly harmonic signals with relatively slowly varying sinusoidal components. Sinusoidal modeling offers a parametric representation of audible signal components such that the original signal can be recovered by synthesis, i.e., by addition (or superposition) of the (harmonic and residual) components.

Rotating mechanical systems such as combustion engines of cars have highly harmonic content and a broadband noise signal; a "sinusoids plus residual" model is thus very suitable for analyzing and synthesizing the sound produced by a real combustion engine. For this purpose, the sound generated by a combustion engine may be recorded using one or more microphones positioned outside the car while the car is placed, for example, in a chassis roller dynamometer and operated in different load conditions and at various rotational engine speeds. The resulting audio data may be analyzed to "extract" model parameters from the audio data, which may be used later (e.g., in an electric car) to easily reproduce the motor sound with an appropriate synthesizer. The model parameters are generally not constant, but may vary depending particularly on the rotational engine speed.

Figure 1:
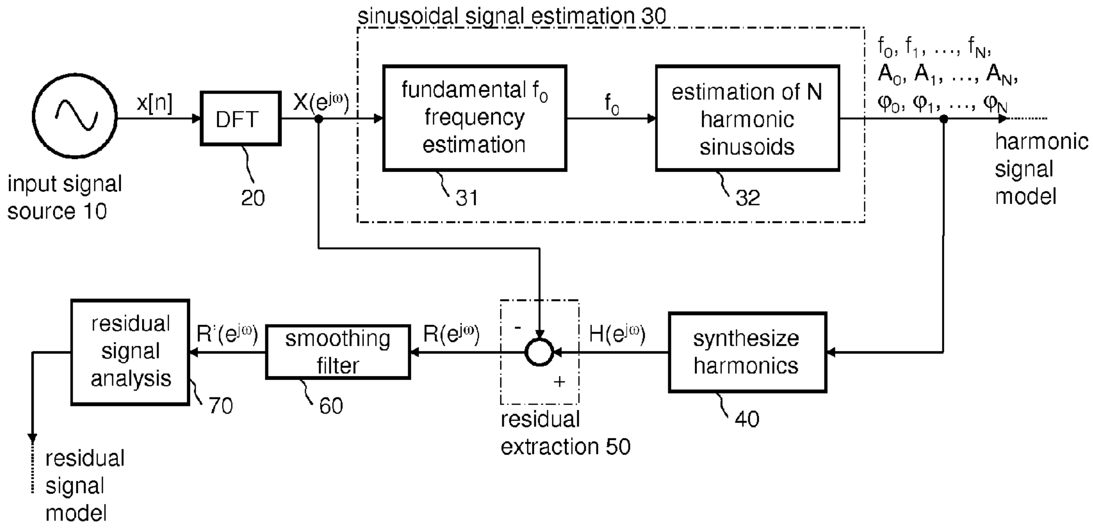
FIG. 1 is a block diagram illustrating a general example of an engine sound analysis based on a sinusoid signal model.

FIG. 1 illustrates a system for analyzing an audio signal in the frequency domain to extract the aforementioned model parameters. The time-discrete input signal x[n] (with time index n) is the audio data obtained by measurement, as discussed above. In FIG. 1, the measurement is generally symbolized by input signal source 10, which provides input signal x[n]. Input signal x[n] may be transformed into the frequency domain using a digital short-time Fourier transform (STFT) algorithm (e.g., an FFT algorithm). The function block that performs the STFT to generate input signal $X(e^{j\omega})$ in the frequency domain is labelled with reference numeral 20 in FIG. 1. Starting with input signal $X(e^{j\omega})$ in the frequency domain, all the following signal analysis is conducted in the frequency domain. Signal processing is, however, not limited to the frequency domain. Signal processing may be performed partially or even exclusively in the time domain. When using frequency-domain signal processing, however, the number of harmonic sinusoids is only limited by the used FFT length.

In accordance with the system illustrated in FIG. 1, input signal $X(e^{j\omega})$ may be supplied to function block 30, which performs the estimation of the sinusoidal signal components. In the present example, this function is divided into two parts: the estimation of fundamental frequency $f_0$ (function block 31) and the estimation of the N harmonic sinusoids (function block 32) that have frequencies $f_1, f_2, \ldots, f_N$. Many methods for accomplishing this task are known in the field and are not discussed here in detail. All methods, however, are based on a signal model that can be expressed as follows:

$$x[n]=A_0\cdot\sin(\omega_0 n+\phi_0)+A_1\cdot\sin(\omega_1 n+\phi_1)+\ldots+A_N\cdot\sin(\omega_N n+\phi_N)+r[n] \quad (1)$$

That is, input signal x[n] is modeled as a superposition of the following: a sinusoid signal that has fundamental frequency $f_0$ (corresponding to angular frequency $\omega_0$), N harmonic sinusoids that have frequencies $f_1$ to $f_N$ (corresponding to angular frequencies $\omega_1$ to $\omega_N$, respectively) and a broadband, non-periodic residual signal r[n]. The results of the sinusoidal signal estimation (block 30) are three corresponding vectors, including estimated frequencies $f=(f_0, f_1, \ldots, f_N)$, corresponding magnitudes $A=(A_0, A_1, \ldots, A_N)$ and phase values $\phi=(\phi_0, \phi_1, \ldots, \phi_N)$, wherein phase $\phi_0$ of the fundamental frequency may be set to zero. These vectors f, A and $\phi$, representing frequency, magnitude and phase values, may be determined for various different fundamental frequencies, e.g., corresponding to rotational engine speeds of 900 rpm, 1,000 rpm, 1,100 rpm, etc. Furthermore, vectors f, A and $\phi$ may be determined for different engine loads or for other non-acoustic parameters (gear number, active reverse gear, etc.) that represent the operational mode of the engine.

To estimate residual signal r[n], which may also be dependent on one or more non-acoustic parameters (gear number, active reverse gear, etc.), the estimated model parameters (i.e., vectors f, A and $\phi$) are used to synthesize the total (estimated) harmonic content of the input signal by superposition of the individual sinusoids. This is accomplished by block 40 in FIG. 1; the resulting estimated harmonic portion of the input signal is denoted as $H(e^{j\omega})$ in the frequency domain and h[n] in the time domain. Synthesized signal $H(e^{j\omega})$ may be subtracted (see block 50) from input signal $X(e^{j\omega})$ to obtain residual signal $R(e^{j\omega})$, which is the frequency domain equivalent of the time-domain signal r[n] mentioned before. The residual signal may be subject to filtering (e.g., by non-linear smoothing filter 60). Such a filter may be configured to smooth the residual signal, i.e., to suppress transient artifacts, spikes or the like in the estimated residual signal $R(e^{j\omega})$. Filtered residual signal $R'(e^{j\omega})$ is supplied to block 70, which represents the signal analysis performed to obtain model parameters that characterize the residual signal. This signal analysis may include, among other things, linear predictive coding (LPC) or simply the calculation of the residual signal's power spectrum. For example, the residual signal's power spectrum may be calculated in different spectral regions (frequency bands in accordance with a psycho-acoustically motivated frequency scale; see, e.g., Fastl, Hugo; Zwicker, Eberhard; *Psychoacoustics* (3rd. edition), Springer, 2007), which may be chosen in consideration of psycho-acoustically critical band limits. Using a psycho-acoustically motivated frequency scale such as the Bark or the Mel scale allows a massive reduction in computation time and memory usage.

Having thus obtained the "harmonic" signal model parameters for different fundamental frequencies and the residual signal model parameters for different non-acoustic parameters (e.g., rotational speed values of the engine, gear number, engine load, etc.), these model parameters may later be used to synthesize a realistic engine sound that corresponds to the sound produced by the engine analyzed in accordance with FIG. 1.

Figure 2:
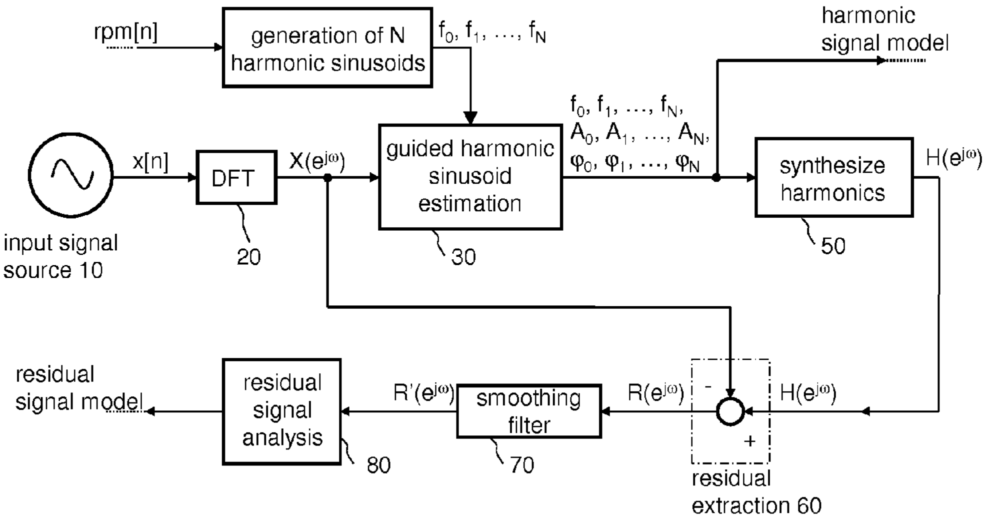
FIG. 2 is a block diagram illustrating an example of an engine sound analysis based on a model that utilizes an external guiding signal to estimate the harmonic sinusoid signal content present in an input signal.

FIG. 2 illustrates another example of signal analysis, which can be seen as an alternative to the signal analysis in accordance with FIG. 1. The structure of the signal analysis of FIG. 2 corresponds to the signal analysis of FIG. 1, except for the functional principle of sinusoidal signal estimation 30. The remaining parts of the block diagram of FIG. 2 are identical to the example of FIG. 1. In the present example, a guided harmonic sinusoid estimation is performed, wherein rpm signal rpm[n] is used as a guide signal. Nevertheless, any signal or group of signals representing the state of the engine may be used as a guide signal (which may be a vector signal). In particular, the guide signal may be composed of at least one of the following signals: a signal representing the rotational speed of the engine, a signal representing the throttle position and a signal representing the engine load. In this context, the rpm signal may generally be a signal representing the rotational speed of the engine, which may be provided, for example, by the engine control unit (also known as power train control module, which is accessible in many cars via the controller area network bus, CAN bus). When using a guided sinusoid estimation, the fundamental frequency is not estimated from input signal $X(e^{j\omega})$, but may rather be directly obtained from the guide signal: in the present example, rpm signal rpm[n] of the engine being tested. For example, an engine speed of 1,200 rpm results in a fundamental frequency of 120 Hz for a six-cylinder combustion engine. The higher harmonics may also depend, e.g. on the engine load and the throttle position.

For a guided sinusoid signal estimation, the following signal model may be used. Accordingly, input signal x[n] is modeled as the following:

$$x[n] = \sum_{i=1,2,\ldots} A_i \cdot \sin(2\pi \cdot i \cdot f_0 \cdot n + \varphi_i) \tag{2}$$

wherein n is the time index, i denotes the number of the harmonic, $f_0$ denotes the fundamental frequency, $A_i$ is the amplitude and $\phi_i$ is the phase of the $i^{th}$ harmonic. As mentioned above, the fundamental frequency and the frequencies of the higher harmonics are not estimated from input signal x[n], but can be directly derived from guide signal rpm[n]. The block labelled "generation of N harmonic sinusoids" in FIG. 2 represents this functionality. The corresponding amplitude $A_i$ and phase values $\phi_i$ are estimated using signal processing methods that are known in the field. For example, fast Fourier transform (FFT) algorithms may be used, or the Goertzel algorithm may be used if only a few harmonics are to be estimated. A fixed number of N frequencies are usually considered. One example of guided harmonic estimation in the context of speech processing is described in Christine Smit and Daniel P. W. Ellis, *Guided Harmonic Sinusoid Estimation in a Multi-Pitch Environment*, in: 2009 IEEE Workshop on Applications of Signal Processing to Audio and Acoustics, Oct. 18-21, 2009.

Figure 3:
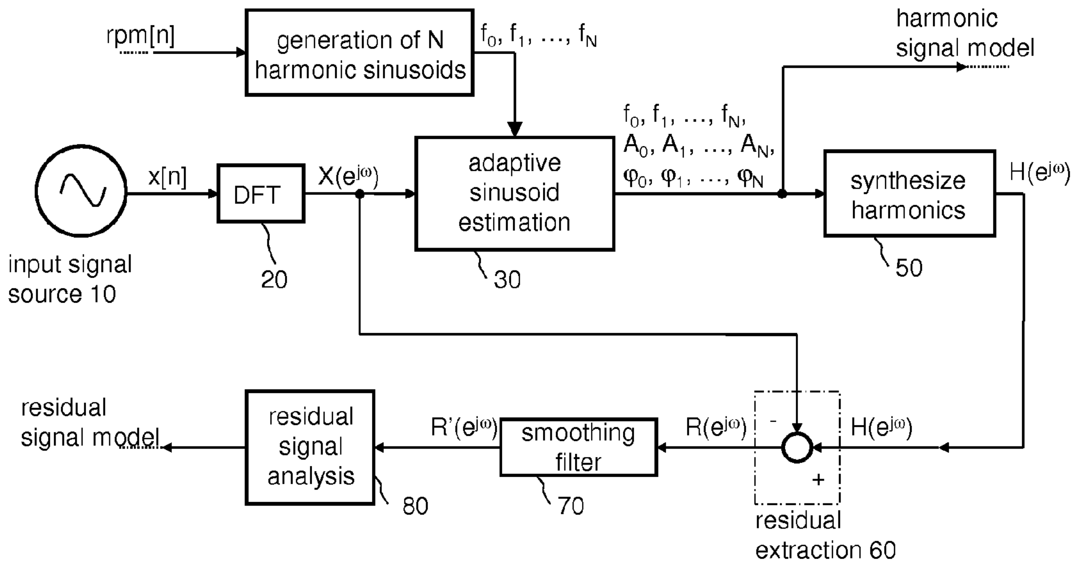
FIG. 3 is a block diagram of another example of an engine sound analysis that uses an adaptive guided estimation of the harmonic sinusoid signal content.

FIG. 3 illustrates a modification of the example presented in FIG. 2. Both block diagrams are essentially identical except for signal processing block 30, which represents the sinusoidal signal estimation. The guided adaptive sinusoid estimation algorithms may take frequency vector f, including fundamental frequency $f_0$ and the frequency of at least one higher harmonic ($f_1$, $f_2$, etc.), as a parameter and adaptively "fine-tune" these frequencies to best match input signal $X(e^{j\omega})$. Accordingly, the estimation may provide a modified frequency vector f', including the fine-tuned frequencies $f_0'$, $f_1'$, etc., as well as the corresponding amplitude vector $A'=[A_0', A_1', A_2', \ldots]$ and phase vector $\phi=[\phi_0', \phi_1', \phi_2', \ldots]$. An adaptive algorithm may be used, particularly in cases when the guide signal (e.g., rpm signal rpm[n]) is of insufficient quality. Mechanical systems such as the power train of an automobile usually have a very high Q-factor; even small deviations (in the range of a few Hertz) between rpm signal rpm[n] and the true engine speed may thus significantly deteriorate the estimation result, particularly for higher harmonics.

Figure 4:
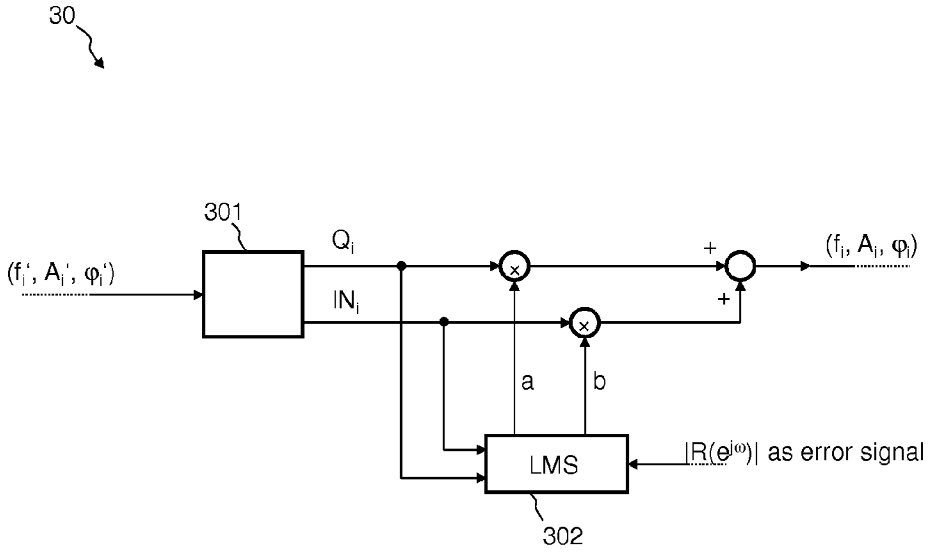
FIG. 4 is a block diagram illustrating the adaptation of the harmonic sinusoid signal component in the example of FIG. 3.

FIG. 4 is a block diagram illustrating an exemplary procedure for adapting one frequency $f_i$ (i=1, N) component (as well as its amplitude $A_i$ and phase $\phi_i$) included in frequency vector f using a least mean square (LMS) optimization algorithm. The result of the adaptation is a fine-tuned sinusoid represented by the triple $f_i'$, $A_i'$ $\phi_i'$. The starting point for the adaptation is a sinusoid (represented by the triple $f_i$, $A_i$, $\phi_i$) estimated using the basic approach described in FIG. 2. That is, the initial values of $f_i'$, $A_i'$ and $\phi_i'$, which are then optimized using the adaptive algorithm described herein, may be obtained using a guided harmonic sinusoid estimation with which frequencies $f_i$ (i=1, 2, . . . , N) are simply calculated as multiples of fundamental frequency $f_0$, which is directly derived from a (non-acoustic or acoustic) guide signal, e.g., from a rotational speed signal in an automotive application. For the adaptation, the initial sinusoid represented by $f_i$, $A_i$ and $\phi_I$ is regarded as a phasor, which is decomposed into quadrature and in-phase components $Q_i$ and $IN_i$ (see signal processing block 301). These components $Q_i$ and $IN_i$ may be weighted by time-variant weighting factors a and b, respectively, and then summed (complex number addition, i.e., $IN_i+j\cdot Q_i$, j being the imaginary unit) to obtain the modified (optimized) phasor represented by $f_i'$, $A_i'$ and $\phi_i'$.

Weighting factors a and b are determined by LMS optimization block 302, which is configured to adjust weighting factors a and b such that an error signal is minimized (in a least square sense, i.e., an $l^2$ norm of the signal is minimized). Residual signal $R(e^{j\omega})$, obtained using the residual extraction 60 shown in FIG. 3, may be used as an error signal. That is, the "goal" of the adaptation is to minimize the power of residual signal $R(e^{j\omega})$ and to maximize the total power of the harmonic signal component. The actual optimization algorithm may be any appropriate minimization algorithm, for example an LMS algorithm, that is based on the "steepest gradient" method. All these methods are well known and are therefore not discussed here in detail.

The signal analysis illustrated in FIGS. 1-3 may be performed "offline", e.g., with a test car on a chassis roller dynamometer. The aforementioned model parameters (frequency, amplitude and phase vectors f, A, and $\phi$, as well as the residual model parameters) may be measured for various rpm values of the car's engine. For example, the model parameters may be determined for discrete rpm values ranging from a minimum value (e.g., 900 rpm) to a maximum value (e.g., 6,000 rpm) in intervals (e.g., 100 rpm). If for later sound synthesis the model parameters are required for an intermediate rpm value (e.g., 2,575 rpm), they may be obtained by interpolation. In the present example, the model parameters for 2,575 rpm may be calculated from the model parameters determined for 2,500 rpm and 2,600 rpm using linear interpolation.

In order to determine the model parameters, the rotational speed of the engine of the car being tested may be continuously ramped up from the minimum to the maximum rpm value. In this case, the model parameters determined for rpm values within a given interval (e.g., from 950 rpm to 1,049 rpm) may be averaged and associated with the center value of the interval (1,000 rpm in the present example). If other additional guide signals (e.g., engine load) are to be considered, data acquisition and model parameter estimation are performed analogously to the case described wherein the rpm signal was the guide signal.

Figure 5:
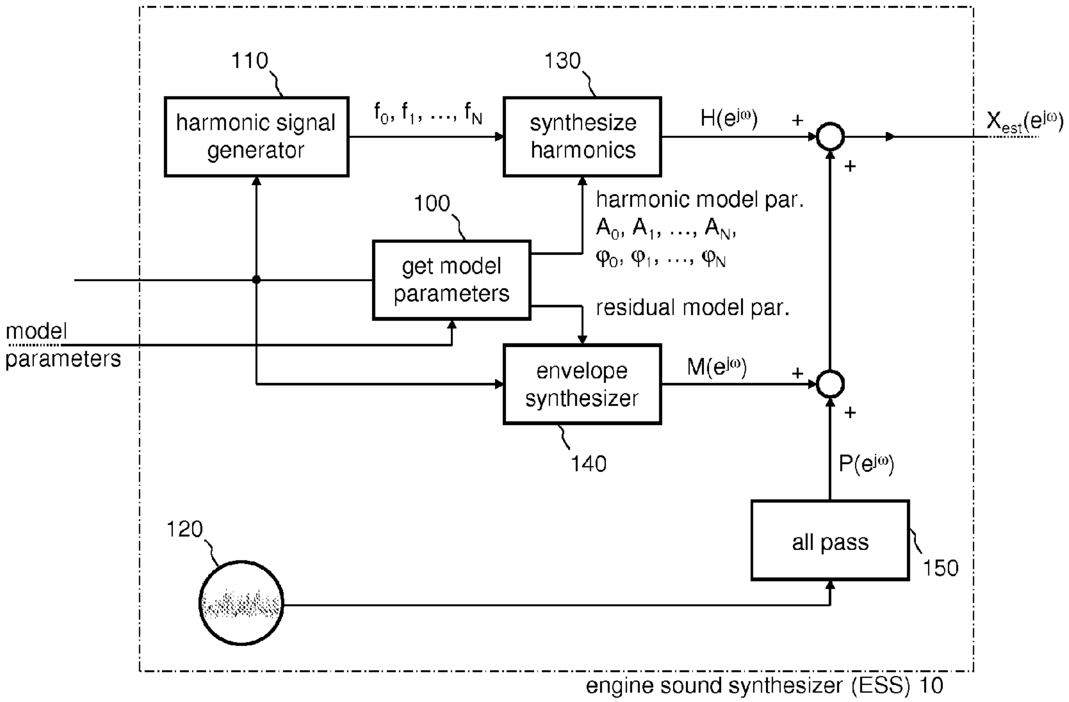
FIG. 5 is a block diagram illustrating the synthesis of engine sound using signal models obtained by the signal analysis in accordance with one of the examples of FIGS. 1-3.

FIG. 5 is a block diagram illustrating the engine sound synthesis that makes use of the model parameters determined in accordance with the signal analysis illustrated in FIGS. 1-3. In the present example, engine sound synthesizer 10 only uses one guide signal (rpm signal rpm[n]). However, other guide signals may be used additionally or alternatively. Guide signal rpm[n] is supplied to harmonic signal generator 110 and to model parameter database 100. Signal generator 100 may be configured to provide fundamental frequency $f_0$ and frequencies $f_1$, $f_2$, etc. of the higher harmonics. These frequency values, i.e., frequency vector $f=[f_0, f_1, \ldots, f_N]$, may be supplied to harmonic signal synthesizer 130. Synthesizer 130 also receives the harmonic model parameters, which fit to the current guide signal rpm[n] from model parameter database 100. Model parameter database 100 may also provide the model parameters that describe the residual model which may represent, e.g., the power spectrum of the residual signal. Furthermore, model parameter database 100 may use interpolation to obtain the correct parameters, as already mentioned above. Harmonic signal synthesizer 130 is configured to provide harmonic signal $H_{est}(e^{j\omega})$, which corresponds to the harmonic content of input signal $X(e^{j\omega})$, which has been estimated therefrom using the signal analysis described above with respect to FIGS. 1-3.

The model parameters describing the residual signal may be provided to envelope synthesizer 140, which recovers the residual signal's magnitude $M(e^{j\omega})$. In the present example, the phase of the residual signal is recovered by all-pass filtering white noise (thus obtaining phase signal $P(e^{j\omega})$) and adding phase signal $P(e^{j\omega})$ to magnitude signal $M(e^{j\omega})$ so as to generate the total residual signal $R_{est}(e^{j\omega})$. The white noise may be generated by noise generator 120. All-pass filter 150 may implement a phase filter by mapping the white noise supplied to the filter input into phase region 0-2π, thus providing phase signal $P(e^{j\omega})$. Synthesized engine sound signal $X_{est}(e^{j\omega})$ may be obtained by adding the recovered harmonic signal $H_{est}(e^{j\omega})$ and the recovered residual signal $R_{est}(e^{j\omega})$. The resulting sound signal in the frequency domain may be transformed into the time domain, amplified and reproduced using common audio reproduction devices.

Generally, the engine sound synthesizer may be regarded as a "black box" that retrieves (i.e., selects) a set of model parameters (e.g., from model parameter database DB residing in a memory) dependent on a guide signal; it then uses these model parameters to synthesize a resulting engine sound signal that corresponds to the guide signal. A set of model parameters may include, for example, fundamental frequency $f_0$, higher harmonics $f_1$, $f_2$, . . . , $f_N$, the corresponding amplitude values $A_0$, $A_1$, $A_2$, . . . , $A_N$ and phase values ($\phi_0$, $\phi_1$, $\phi_2$, . . . , $\phi_N$ and the power spectrum of the residual noise. The guide signal may be a scalar signal (e.g., the rpm signal representing the rotational speed of the engine) or a vectorial signal representing a set of at least two scalar signals including the rpm signal, an engine load signal, a throttle position signal or the like. A specific guide signal value (e.g., a specific rotational speed or engine load) unambiguously defines a respective set of model parameters, which may be obtained as explained above with regard to FIGS. 1-4. In other words, the model parameters are a function of the guide signal.

The model parameters are determined once for various values of the guide signals and are stored as model parameter database DB in, e.g., a non-volatile memory. The model parameters represent the desired engine sound for various situations (represented by the guide signal). However, the synthetic engine sound, which is actually perceived by a person sitting in an electric car, may vary depending on the geometry of the car cabin. That is, the same engine sound represented by the same model parameter database DB may generate different sound impressions for a listener (e.g., the driver or the passenger) in a city car, a family car and a full-size car. The different sound impressions are mainly due to different sizes and shapes of the car cabin.

In the following discussion, the car cabin is used as an exemplary listening room. The position of a listener's (e.g. the driver's or the passenger's) head within the car cabin is referred to as the (approximate) listening position. The room transfer function (RTF) thus represents the transfer characteristic of the room, from the audio signal supplied to the loudspeaker(s) to the acoustic signal arriving at the listening position. In the case of a plurality of loudspeakers and/or a plurality of listening positions, the RTF is a matrix (room transfer matrix), wherein each matrix element represents a scalar RTF representing the transfer characteristics for a specific listening position and an associated loudspeaker (or group of loudspeakers). Using this terminology, it is (mainly) the RTF that is responsible for different engine sound impressions in different types of cars. The sound systems described below may be used to compensate for the effect of different listening rooms and to achieve an (approximately) uniform engine sound impression regardless of the type of the car for a given preset model parameter database DB. Each RTF is uniquely associated with a corresponding room impulse response (RIR), wherein the RIR is the time-domain equivalent of the RTF, which is in the frequency domain.

Figure 6:
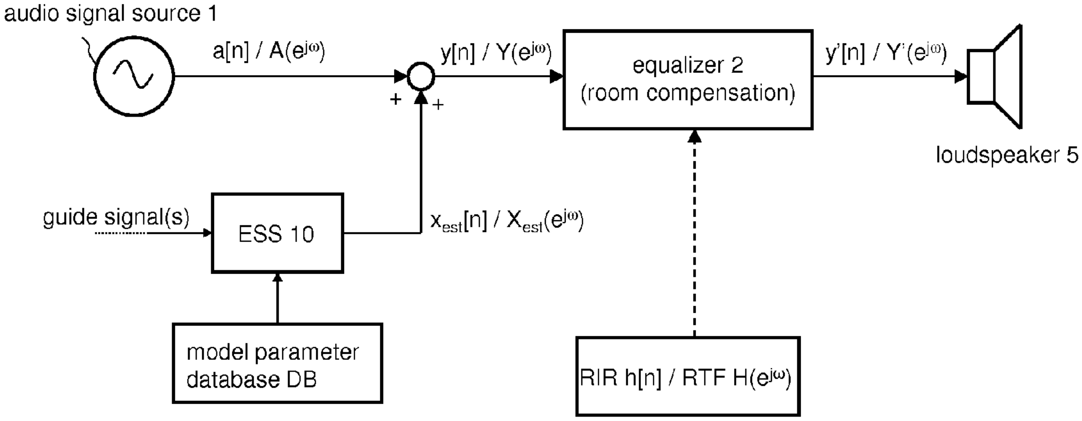
FIG. 6 is a block diagram illustrating an exemplary engine sound synthesizer integrated in a sound system that includes an equalizer for compensation of the listening room's room impulse response.

FIG. 6 illustrates a sound system that includes, inter alia, engine sound synthesizer 10, audio signal source 1 (e.g., a CD player) and equalizer 2. Engine sound synthesizer 10 is supplied with a guide signal (e.g. rpm[n] and/or load[n]) and predefined model parameter database DB, and it is configured to generate the resulting engine sound signal $x_{est}[n]$ by selecting and using a set of model parameters from model parameter database DB in accordance with the current guide signal; the selected set of model parameters are used to synthesize the resulting engine sound signal $x_{est}[n]$. This may be accomplished as explained in FIG. 5. As explained above, the resulting synthetic audio signal $x_{est}[n]$ (which is provided to one or more loudspeakers) will always be the same for a given value of the guide signal(s) and is not affected by the room characteristics of a specific car cabin. That is, synthetic audio signal $x_{est}[n]$ does not depend on the RTF of the listening room in which the audio signal is reproduced. However, the sound reproduction system of FIG. 6 may help to improve the situation.

Audio signal source 1 provides at least one digital audio signal a[n] (e.g., a set of audio signals in the case of stereo or multi-channel audio), to which synthetic engine sound signal $x_{est}[n]$ is added. The at least one resulting sum signal is denoted as y[n]. This addition may also be accomplished in the frequency domain (i.e., $Y(e^{j\omega})=A(e^{j\omega})+X_{est}(e^{j\omega})$), wherein $A(e^{j\omega})$ denotes audio signal a[n] in the frequency domain and $Y(e^{j\omega})$ denotes the sum signal in the frequency domain. However, audio signal source 1 is optional and audio signal a[n] may also be zero. In this case, the sum signal(s) equal(s) synthetic engine sound signal $Y(e^{j\omega})=X^{est}(e^{j\omega})$.

The sum signal is provided to equalizer 2, which is essentially a digital filter that operates in accordance with filter transfer function $G(e^{j\omega})$ (usually a matrix function in the case of more than one audio channel). This filter transfer function(s) $G(e^{j\omega})$ may be designed such that it compensates for the effect of an RTF $H(e^{j\omega})$, which is associated with a respective RIR h[n] of the car cabin (listening room) in which the sound is reproduced. In other words, equalizer 2 is configured to equalize room transfer function $H(e^{j\omega})$. However, the filter transfer function(s) $G(e^{j\omega})$ may be designed to provide any desired frequency response in order to tune the resulting sound output in a desired manner. A brief outline is given below about how an RIR may be obtained for a specific listening room and how the corresponding equalization filter coefficients (also referred to as filter impulse response) may be designed such that the equalization filter compensates for the effect of the listening room.

RIR $H(e^{j\omega})$ can generally be measured or estimated using various known system identification techniques. For example, a test signal can be reproduced through a loudspeaker or a group of loudspeakers, while the resulting acoustic signal that arrives at the desired listening position within the listening room is measured by a microphone. RTF $H(e^{j\omega})$ may then be obtained by filtering the test signal with an adaptive (FIR) filter and iteratively adapting the filter coefficients such that the filtered test signal matches the microphone signal. When the filter coefficients have converged, the filter impulse response (i.e., the filter coefficients in the case of an FIR filter) of the adaptive filter matches the sought RIR h[n]. The corresponding RTF $H(e^{j\omega})$ can be obtained by transforming the time-domain RIR h[n] into the frequency domain. The actual equalization filter transfer function $G(e^{j\omega})$ may then be obtained by inversion of RTF $H(e^{j\omega})$. Such inversion may be a challenging task. However, various suitable methods are known in the field and are thus not discussed further here. In practice, an individual RIR can be obtained for each pair of a loudspeaker and a listening position within the considered listening room. For example, when considering four loudspeakers and four listening positions, 16 RIRs may be obtained. These 16 RIRs may be arranged in a room impulse response matrix, which can be converted to a corresponding transfer matrix in the frequency domain. As such, the RTF generally has a matrix form in the case of more than one audio channel. Consequently, the filter transfer function characterizing the equalizer also has a matrix form. In a practical case, in which one digital filter is applied to each audio channel, the transfer matrix can be regarded as diagonal matrix. In accordance with one embodiment, the filter transfer function(s) $G(e^{j\omega})$ may be pre-determined for a any specific listening room and programmed into a non-volatile memory of the digital signal processing unit, which executes the digital filtering. However, the RIRs of a listening room may be dynamically updated (using measurements) and updated filter coefficients for the filter(s) $G(e^{j\omega})$ may be obtained based on the current RIRs. However, the equalizing filter(s) are not necessarily directly controlled by the RIRs. Various different methods are known for calculating equalization filter coefficients from measured RIRs, for example in the U.S. Pat. No. 8,160,282 B2.

In the system illustrated in FIG. 6, synthetic engine sound signal $x_{est}[n]$ (optionally superposed with at least one audio signal a[n]) is equalized by equalizer 2, which compensates for the effect of RIR h[n] (a matrix in the case of more than one channel) of the listening room. That is, equalizer 2 has filter transfer function $G(e^{j\omega})$ (representing a set of equalizing filter parameters), which includes at least the (approximate) inverse of RTF $H^{-1}(e^{j\omega})$. As mentioned, transfer functions $G(e^{j\omega})$ and $H^{-1}(e^{j\omega})$ are both matrices in the case of more than one channel (multi-channel).

As the RIR of a car cabin may change and depend, for example, on the number of people sitting in the car, filter transfer function $G(e^{j\omega})$ (i.e., the equalizing filter parameter set) of the equalizer may be regularly updated or continuously adapted so as to match the current RIR. For this purpose, microphones are needed in close proximity to the listening position(s) within the listening room. However, suitable microphones are often installed in premium cars equipped with an active noise cancellation (ANC) system. As mentioned above, a matrix of RIRs replaces the scalar RIR in the case of multiple audio channels and/or listening positions. Consequently, the transfer behavior of the equalizer is characterized by a matrix of transfer functions (transfer matrix) instead of a scalar transfer function. The single-channel case is illustrated in the figures, however, to show the principle and avoid complicated illustrations.

In the example of FIG. 6, equalizer 2 of the on-board audio system is used to equalize both audio signal a[n] and synthetic engine sound signal $x_{est}[n]$. For this purpose, signals a[n] and $x_{est}[n]$ are superposed (added) and sum signal y[n] is supplied to equalizer 2, which is disposed downstream of engine sound synthesizer 10. The alternative example illustrated in FIG. 7 uses a different approach, according to which the synthetic engine sound signal (denoted as $x_{est}'$ [n] in the present example) is superposed with an already equalized audio signal a'[n], yielding (equalized) sum signal y'[n]. That is, in the example of FIG. 7, equalizer 2 is disposed in a signal path parallel to the signal path of synthetic engine sound signal $x_{est}'$ [n]; consequently, equalizer 2 is not needed to equalize synthetic engine sound signal $x_{est}'[n]$, but rather only to equalize (optional) audio signal a[n]. In order to obtain a properly equalized synthetic engine sound signal $x_{est}'[n]$, predefined model parameter database DB is modified in accordance with an equalizing filter parameter set, which depends on RIR h[n] of the listening room (car cabin) or, in the case of more than one channel, in accordance with the matrix of RIRs. The model parameters in predefined model parameter database DB are modified such that the resulting modified model parameter database DB' contains model parameters that yield (at the output of ESS 10) synthetic engine sound signal $x_{est}[n]$ (for each audio channel), which is already equalized in accordance with RIR h[n]. The incorporation of the equalization into the model parameters may be achieved, for example, by a simple multiplication of the corresponding amplitude values $A_0, A_1, A_2, \ldots, A_N$ and phase values $\phi_0, \phi_1, \phi_2, \ldots, \phi_N$ (associated with fundamental frequency $f_0$ and higher harmonics $f_1, f_2, \ldots, f_N$) with the corresponding transfer function $G(e^{j\omega})$ of the equalization filter (which is approximately $H^{-1}(e^{j\omega})$). In the case of more than one channel, this is done for each audio channel.

Some aspects of the present disclosure are summarized below. It should be noted, however, that the following discussion is not exhaustive or complete.

One aspect relates to a method for analyzing sound, particularly engine sound signals picked up near a combustion engine. The method includes determining a fundamental frequency of an input signal to be analyzed, thereby making use of the input signal or at least one guide signal. Furthermore, the frequencies of the higher harmonics corresponding to the fundamental frequency are determined, thus resulting in harmonic model parameters. The method further includes synthesizing a harmonic signal based on the harmonic model parameters and subtracting the harmonic signal from the input signal to obtain a residual signal. Finally, residual model parameters are estimated based on the residual signal.

The input signal may be transformed into the frequency domain, thus providing a frequency domain input signal, before being processed further. In this case, the amount of higher harmonics that can be considered is only limited to the length of the input vectors used, e.g., by the FFT (fast Fourier transform) algorithm that provides the transformation into the frequency domain. The processing of the input signal may generally be fully performed in the frequency domain; thus the harmonic signal and the residual signal may also be calculated in the frequency domain.

The fundamental frequency and the frequencies of the higher harmonics may be derived from at least one guide signal in order to avoid an estimation of the fundamental frequency (and of the frequencies of the higher harmonics) directly from the input signal, which is typically computationally complex.

The harmonic model parameters may include a frequency vector of the fundamental frequency and the frequencies of the higher harmonics, a corresponding amplitude vector and a corresponding phase vector. Determining the harmonic model parameters may include estimating phase and amplitude values associated with the fundamental frequency and the frequencies of the higher harmonics. Determining the harmonic model parameters may generally include fine-tuning of the fundamental frequency and the frequencies of the higher harmonics obtained from at least one guide signal. Such fine-tuning may entail an iterative modification of the frequencies of the higher harmonics and their corresponding (estimated) amplitude and phase values such that a norm of the residual signal (e.g., an $L^2$ norm) is minimized. This fine-tuning can be regarded as a kind of optimization process.

The residual signal may be filtered with a non-linear filter to smooth the residual signal before estimating the residual model parameters. Determining the residual model parameters may include calculating the power spectrum of the residual signal. The power spectral density may be calculated for different frequency bands in accordance with a psycho-acoustically motivated frequency scale so as to consider psycho-acoustically critical band limits.

Another aspect relates to a method for synthesizing a sound signal based on harmonic model parameters and residual model parameters, wherein the parameters may particularly be determined in accordance with the method summarized above. The method includes the calculation of the fundamental frequency and frequencies of a number of higher harmonics based on at least one guide signal. The residual model parameters and the harmonic model parameters that are associated with the calculated frequencies are provided, and a harmonic signal is synthesized using the harmonic model parameters for the calculated fundamental frequency and frequencies of the higher harmonics. Furthermore, a residual signal is synthesized using the residual model parameters. The total sound signal may be calculated by superposing the synthesized harmonic signal and the residual signal.

Pre-filtered white noise may be added to the total sound signal. In particular, the pre-filtering may include the mapping of the white noise amplitude values into the 0-2π phase range, thus generating a phase signal to be added to the total sound signal. Synthesizing the residual signal may generally include the generation of a noise signal that has a power spectral density that corresponds to a power spectral density represented by the residual model parameters.

Another aspect relates to a system for reproducing synthetic engine sound in at least one listening position of a listening room. Each listening position is associated with a room transfer function (RTF). One exemplary system includes model parameter database DB, which contains various predefined sets of model parameters. The system further includes engine sound synthesizer 10 (see FIG. 6), which receives at least one guide signal, wherein those guide signals can be regarded as one vectorial guide signal in the case of more than one guide signal. The guide signal(s) may represent the rotational speed of the engine, the engine load, the throttle position or similar measures that may have an impact on the sound of a combustion engine. Engine sound synthesizer 10 is configured to select one set of model parameters in accordance with the guide signal(s) and to generate synthetic engine sound signal $x_{est}[n]$ or $x_{est}'[n]$ (see FIGS. 6 and 7) in accordance with the selected set of model parameters. At least one loudspeaker 5 is employed to reproduce synthetic engine sound signal $x_{est}[n]$ or $x_{est}'[n]$ by generating a corresponding acoustic engine sound signal. The system further includes either equalizer 2 or a model parameter tuning unit. In the first case, the equalizer receives synthetic engine sound signal $x_{est}[n]$ and filters it in accordance with filter transfer function $G(e^{j\omega})$, which is set such that the effect of the listening room (characterized by the RTF) on the resulting acoustic engine sound signal is approximately compensated at the listening position(s). In the second case, the model parameter tuning unit modifies the predefined sets of model parameters in model parameter database DB in accordance with the equalizing filter parameter set such that the resulting acoustic engine sound signal is approximately compensated at the listening position(s). In this case, the synthetic engine sound signal is generated from a modified set of model parameters.

Each set of model parameters represents at least fundamental frequency $f_0$ and higher harmonic frequencies $f_1$, $f_2$, . . . , $f_N$ of a desired engine sound and the corresponding amplitude values $A_0$, $A_1$, $A_2$, . . . , $A_N$ and phase values $\phi_0$, $\phi_1$, $\phi_2$, . . . , $\phi_N$. A system identification unit may be provided that regularly or continuously measures and updates the RTF used by the equalizer or the model parameter tuning unit.

Figure 7:
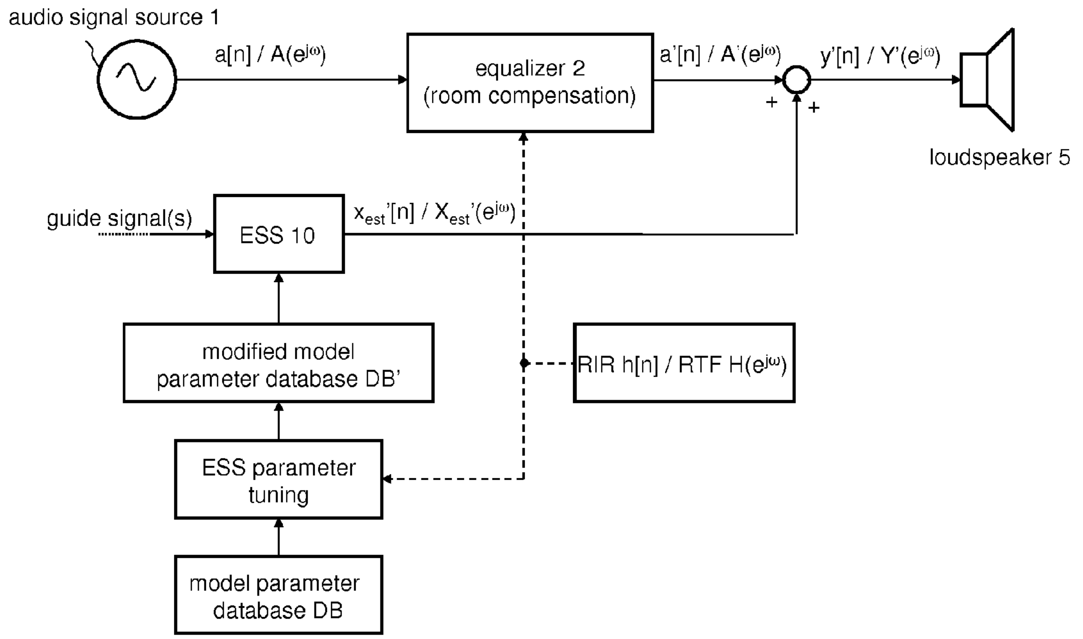
FIG. 7 includes an alternative solution to the example of FIG. 6.
Figure 8:
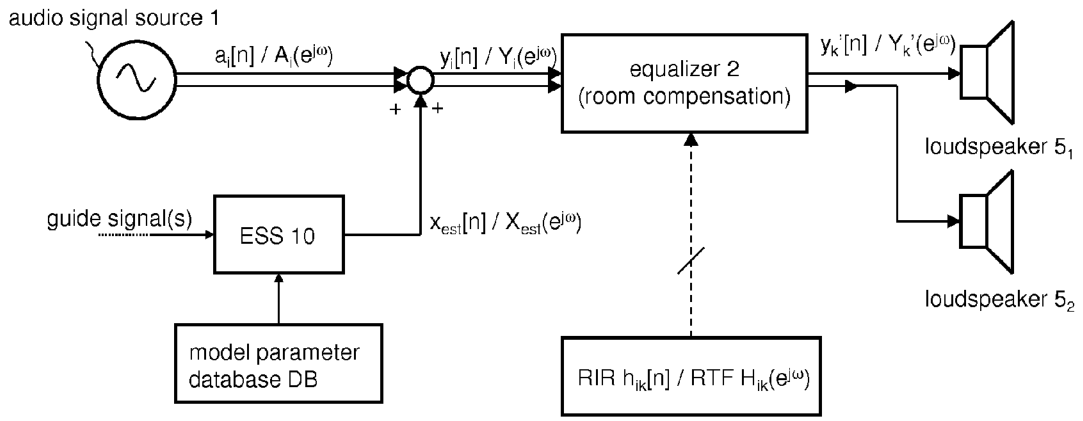
FIG. 8 is a block diagram illustrating a multi-channel generalization of the example of FIG. 6.
Figure 9:
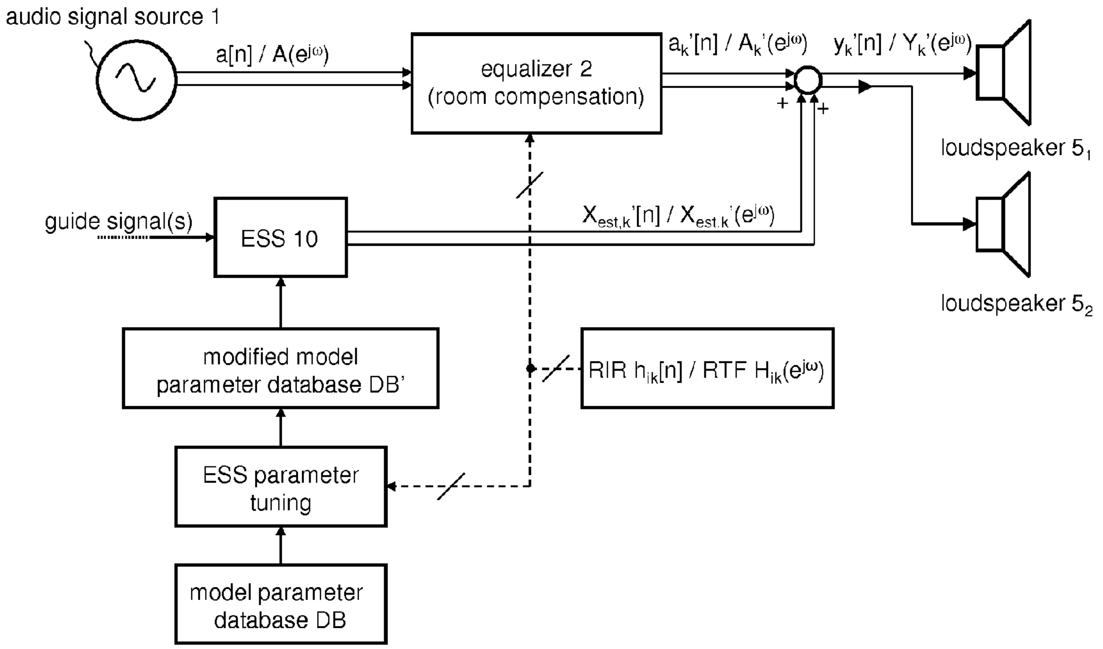
FIG. 9 is a block diagram illustrating a multi-channel generalization of the example of FIG. 7.

FIGS. 8 and 9 illustrate generalizations of the examples of FIGS. 6 and 7, respectively, for the case of multiple audio channels and loudspeakers. The subscripts i and k of signals a[n], $x_{est}[n]$, y[n], etc. relate to the individual audio channels, wherein i={1, 2, . . . , N} and k={1, 2, . . . , N}. In the depicted examples, N=2. In the example of FIG. 8, audio signal source 1 provides two audio signals $a_i[n]$ (i={1, 2}), each of which is superposed with synthetic engine sound signal $x_{est}[n]$. Sum signal $y_i[n]=a_i[n]+x_{est}[n]$ is then supplied to equalizer 2, which filters the signal in accordance with a transfer matrix designed to compensate for room impulse responses $h_{ik}[n]$. Filtered signals $y_k'[n]$ are then supplied to the respective loudspeakers $\mathbf{5}_k$ (k={1, 2}).

In the example of FIG. 9, synthetic engine sound signal $x_{est,k}[n]$ is generated for each audio channel. Equalized audio signals $a_k'[n]$ are superposed with synthetic engine sound signals $x_{est,k}[n]$; sum signals $y_k'[n]$ are then supplied (after conversion to analog signals and amplification) to the respective loudspeakers $\mathbf{5}_k$ (k={1, 2}). Apart from the multichannel enhancement described above, the examples of FIGS. 8 and 9 are identical to the previous examples of FIGS. 6 and 7.

Although various exemplary embodiments have been disclosed, it will be apparent to those skilled in the art that changes and modifications can be made according to a specific implementation of the various embodiments without departing from the spirit and scope of the invention. It will be obvious to those reasonably skilled in the art that other components performing the same functions may be suitably substituted. In particular, signal processing functions may be performed either in the time domain or in the frequency domain to achieve substantially equal results. It should be mentioned that features explained with reference to a specific figure may be combined with features of other figures, even those not explicitly mentioned. Furthermore, the methods of the invention may be achieved in either all software implementations that use the appropriate processor instructions or in hybrid implementations that utilize a combination of hardware logic and software logic to achieve the same results. Such modifications to the concept are intended to be covered by the appended claims.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A system for reproducing synthetic engine sound in at least one listening position of a listening room using at least one loudspeaker; the system comprising:

a model parameter database including various pre-defined sets of model parameters;

an engine sound synthesizer which receives at least one guide signal, the engine sound synthesizer is configured to select one set of model parameters in accordance with the at least one guide signal and to generate a synthetic engine sound signal in accordance with the selected set of model parameters;

at least one loudspeaker for reproducing the synthetic engine sound by generating a corresponding acoustic signal; and a model parameter tuning unit, which is configured to modify the pre-defined sets of model parameters in the model parameter database in accordance with an equalizer filter parameter set such that, when the synthetic engine sound signal is generated from a modified set of model parameters, the effect of the listening room on the resulting acoustic signal is approximately compensated at an at least one listening position.

2. The system of claim 1, wherein each set of model parameters represents at least a fundamental frequency and higher harmonic frequencies as well as corresponding amplitude and phase values representing a harmonic component of a desired engine sound and residual model parameters representing a non-harmonic component of the desired engine sound.

3. The system of claim 1, wherein each pair of the at least one listening position and the at least one loudspeaker is associated with a room transfer function (RTF), the system further comprising a system identification unit which is configured to regularly or continuously measure and update the RTFs used by one of an equalizer and the model parameter tuning unit.

4. The system of claim 1, wherein the at least one guide signal includes at least one of the following: a rotational speed signal of an engine, a first signal representing an engine load and a second signal representing vehicle speed.

5. The system of claim 1 further comprising an audio signal source providing at least one audio signal.

6. The system of claim 5, wherein the at least one audio signal is superposed with the synthetic engine sound signal, and a resulting sum signal is supplied to an equalizer.

7. The system of claim 5, wherein the model parameter tuning unit is configured to modify the pre-defined sets of model parameters in the model parameter database in accordance with the equalizer filter parameter set such that, when at least one synthetic engine sound signal is generated from a modified set of model parameters, and at least one resulting acoustic engine signal is approximately compensated at the at least one listening position, so that the effect of the listening room is approximately eliminated; and wherein, the at least one synthetic engine sound signal is superposed with the at least one audio signal before being supplied to the at least one loudspeaker.

8. The system of claim 7, wherein the at least one audio signal is equalized before being superposed to the synthetic engine sound signal.

9. A method for reproducing synthetic engine sound in at least one listening position of a listening room using at least one loudspeaker; the method comprising:

providing a model parameter database including various pre-defined sets of model parameters;

receiving at least one guide signal and selecting one set of model parameters in accordance with the at least one guide signal;

synthesizing at least one synthetic engine sound signal in accordance with the selected set of model parameters;

reproducing the at least one synthetic engine sound signal by generating a corresponding at least acoustic engine sound signal; and modifying the pre-defined sets of model parameters in the model parameter database in accordance with a set of equalizing filter parameters such that, when the at least one synthetic engine sound signal is generated from a modified set of model parameters, the effect of the listening room on the resulting acoustic engine sound signal is approximately compensated at an at least one listening position.

10. The method of claim 9, wherein each set of model parameters represents at least a fundamental frequency and higher harmonic frequencies as well as corresponding amplitude and phase values representing a harmonic component of a desired engine sound and residual model parameters representing a non-harmonic component of the desired engine sound.

11. The method of claim 9 further comprising:

regularly or continuously measuring and updating room transfer functions (RTFs) which are used for obtaining filter coefficients for filtering the at the least one synthetic engine sound signal or used for modifying the pre-defined sets of model parameters in the model parameter database.

12. The method of claim 9, wherein the at least one guide signal includes at least one of the following: a rotational speed signal of an engine, a first signal representing an engine load and a second signal representing vehicle speed.

13. The method of claim 9, further comprising:

providing at least one audio signal; and superposing the at least audio signal with the at least one synthetic engine sound signal to result in a sum signal;

wherein filtering the at least one synthetic engine sound signal in accordance with a filter transfer function includes filtering the sum signal.

14. The method of claim 13, further comprising:

superposing the at least one synthetic engine sound signal obtained from the modified set of model parameters with at least one equalized audio signal, the equalizing being accomplished by filtering the at least one audio signal in accordance with a filter transfer function which is set such that the effect of the listening room on the resulting acoustic engine sound signal is approximately compensated at the at least one listening position.

15. A system for reproducing synthetic engine sound in at least one listening position of a listening room; the system comprising:

a model parameter database including various pre-defined sets of model parameters;

an engine sound synthesizer which receives at least one guide signal, the engine sound synthesizer is configured to select one set of model parameters to provide a selected set of model parameter based on the at least one guide signal and to generate a synthetic engine sound signal based on the selected set of model parameters;

at least one loudspeaker for reproducing a synthetic engine sound with a corresponding acoustic signal; and a model parameter tuning unit to modify the pre-defined sets of model parameters based on an equalizer filter parameter set such that, when the synthetic engine sound signal is generated from a modified set of model parameters, the effect of the listening room on the resulting acoustic signal is approximately compensated at an at least one listening position.

16. The system of claim 15, wherein each set of model parameters represents at least a fundamental frequency and higher harmonic frequencies as well as corresponding amplitude and phase values representing a harmonic component of a desired engine sound and residual model parameters representing a non-harmonic component of the desired engine sound.

17. The system of claim 15, wherein each pair of the at least one listening position and the at least one loudspeaker is associated with a room transfer function (RTF), the system further comprising a system identification unit which is configured to regularly or continuously measure and update the RTFs used by one of an equalizer and the model parameter tuning unit.

18. The system of claim 15, wherein the at least one guide signal includes at least one of the following: a rotational speed signal of an engine, a first signal representing an engine load and a second signal representing vehicle speed.

19. The system of claim 15 further comprising an audio signal source providing at least one audio signal.

20. The system of claim 19, wherein the at least one audio signal is superposed with the synthetic engine sound signal, and a resulting sum signal is supplied to an equalizer.

21. A system for reproducing synthetic engine sound in at least one listening position of a listening room using at least one loudspeaker; the system comprising:

a model parameter database including various pre-defined sets of model parameters;

an engine sound synthesizer which receives at least one guide signal, the engine sound synthesizer is configured to select one set of model parameters in accordance with the at least one guide signal and to generate a synthetic engine sound signal in accordance with the selected set of model parameters;

at least one loudspeaker for reproducing the synthetic engine sound by generating a corresponding acoustic signal; and an equalizer that receives the synthetic engine sound signal and that is configured to filter the synthetic engine sound signal in accordance with a filter transfer function, which is set such that an effect of the listening room on a resulting acoustic engine sound signal is approximately compensated at the at least one listening position;

wherein each set of model parameters represents at least a fundamental frequency and higher harmonic frequencies as well as corresponding amplitude and phase values representing a harmonic component of a desired engine sound and residual model parameters representing a non-harmonic component of the desired engine sound.

22. A method for reproducing synthetic engine sound in at least one listening position of a listening room using at least one loudspeaker; the method comprising:

providing a model parameter database including various pre-defined sets of model parameters;

receiving at least one guide signal and selecting one set of model parameters in accordance with the at least one guide signal;

synthesizing at least one synthetic engine sound signal in accordance with the selected set of model parameters;

reproducing the at least one synthetic engine sound signal by generating a corresponding at least acoustic engine sound signal; and filtering the at least one synthetic engine sound signal in accordance with a filter transfer function which is set such that an effect of the listening room on a resulting acoustic engine sound signal is approximately compensated at the at least one listening position;

wherein each set of model parameters represents at least a fundamental frequency and higher harmonic frequencies as well as corresponding amplitude and phase values representing a harmonic component of a desired engine sound and residual model parameters representing a non-harmonic component of the desired engine sound.

* * * * *